US011315252B2

(12) United States Patent
Lyu et al.

(10) Patent No.: US 11,315,252 B2
(45) Date of Patent: *Apr. 26, 2022

(54) SYSTEMS AND METHODS FOR MAGNETIC RESONANCE IMAGE RECONSTRUCTION

(71) Applicant: UIH AMERICA, INC., Huston, TX (US)

(72) Inventors: Jingyuan Lyu, Huston, TX (US); Yu Ding, Huston, TX (US); Qi Liu, Huston, TX (US); Jian Xu, Huston, TX (US)

(73) Assignee: UIH AMERICA, INC., Huston, TX (US)

( * ) Notice: Subject to any disclaimer, the term of this patent is extended or adjusted under 35 U.S.C. 154(b) by 46 days.

This patent is subject to a terminal disclaimer.

(21) Appl. No.: 16/876,147

(22) Filed: May 18, 2020

(65) Prior Publication Data

US 2020/0279375 A1  Sep. 3, 2020

Related U.S. Application Data

(63) Continuation of application No. 16/008,296, filed on Jun. 14, 2018, now Pat. No. 10,657,646.

(51) Int. Cl.
*G06T 7/00* (2017.01)
*G01R 33/56* (2006.01)
*G01R 33/48* (2006.01)

(52) U.S. Cl.
CPC ........ *G06T 7/0016* (2013.01); *G01R 33/4824* (2013.01); *G01R 33/5602* (2013.01); *G06T 2207/10088* (2013.01)

(58) Field of Classification Search
CPC ....... G06T 5/002; G06T 5/001; G06T 7/0016; G06T 7/0012; G06T 7/20; G06T 11/008; G06T 11/003; G06T 11/005; G06T 11/006; G06T 2207/10088; G06T 2207/10092; G06T 2207/10096; G06T 2211/421; G06T 2211/424; G06T 2211/436; G06T 2210/41; G01R 33/5602; G01R 33/4824; G01R 33/56509; G01R 33/56325; G01R 33/5611; G01R 33/4818; G01R 33/4826;

(Continued)

(56) References Cited

U.S. PATENT DOCUMENTS

2011/0234222 A1* 9/2011 Frahm ................ G01R 33/4824
324/309
2015/0077112 A1* 3/2015 Otazo .................... G01R 33/28
324/318

(Continued)

*Primary Examiner* — Jose L Couso
(74) *Attorney, Agent, or Firm* — Metis IP LLC

(57) ABSTRACT

A method may include acquiring MR signals by an MR scanner and generating image data in a k-space according to the MR signals. The method may also include classifying the image data into a plurality of phases. Each of the plurality of phases may have a first count of spokes. A spoke may be defined by a trajectory for filling the k-space. The method may also include classifying the plurality of phases of the image data into a plurality of groups and determining reference images based on the plurality of groups. Each of the reference images may correspond to the at least one of the phases of the image data. The method may further include reconstructing an image sequence based on the reference images and the plurality of phases of the image data.

20 Claims, 9 Drawing Sheets

(58) Field of Classification Search
CPC ............ G01R 33/4835; G01R 33/4816; G01R 33/56308; G01R 33/482; G01R 33/5676; G01R 33/4808; G01R 33/5615; G01R 33/5608; A61B 5/055; A61B 5/7207; A61B 5/7203; A61B 2576/00; G16H 30/40; G06K 9/0051
See application file for complete search history.

(56) References Cited

U.S. PATENT DOCUMENTS

| | | | |
|---|---|---|---|
| 2016/0047874 A1 | 2/2016 | Grodzki et al. | |
| 2016/0310761 A1* | 10/2016 | Li | A61B 5/055 |
| 2017/0307703 A1* | 10/2017 | Wiesinger | G01R 33/5616 |
| 2017/0332939 A1 | 11/2017 | Subashi et al. | |
| 2018/0156884 A1* | 6/2018 | Heidemann | G01R 33/4818 |
| 2018/0204358 A1* | 7/2018 | An | A61B 5/055 |
| 2019/0012813 A1 | 1/2019 | Bauer et al. | |
| 2019/0113587 A1 | 4/2019 | Paulson et al. | |

* cited by examiner

SYSTEMS AND METHODS FOR MAGNETIC RESONANCE IMAGE RECONSTRUCTION

CROSS-REFERENCE TO RELATED APPLICATIONS

This application is a continuation of U.S. patent application Ser. No. 16/008,296, filed on Jun. 14, 2018, the entire contents of which are hereby incorporated by reference.

TECHNICAL FIELD

This disclosure generally relates to magnetic resonance imaging (MRI) technology, and more particularly, to methods and systems for MRI image reconstruction.

BACKGROUND

Magnetic resonance imaging (MRI) systems are widely used in medical diagnose. MRI systems use a powerful magnetic field and radio frequency (RF) techniques to generate images of the object to be scanned. The motion of the object (e.g., heartbeats) during MR scanning may cause motion artifacts and/or noises in an MR image. Some techniques have recently been developed to reduce such artifacts due to the motion of the object. For example, electrocardiogram (ECG) gating techniques have been employed in the process for reconstructing cardiac cine-MRI images in real-time. The operator of the MRI system using such methods, however, may need to identify cardiac or respiratory events causing the motion of the object by, for example, adjusting a great number of parameters (e.g., trigger delay, trigger window,) associated with the pulse sequence for acquiring MR signals in order to reduce an influence of the movement of the heart on the cardiac cine-MRI image, and it may be burdensome and time-consuming. Thus, it is desirable to provide systems and methods for reconstructing a cardiac cine-MRI image without the burden of manually identifying cardiac or respiratory events causing the motion of the object.

SUMMARY

According to an aspect of the present disclosure, a method implemented on a magnetic resonance imaging (MRI) system is provided. The MRI system may include a magnetic resonance (MR) scanner and a computing device. The computing device may include at least one processor and at least one storage device. The method may include acquiring, by the MR scanner, MR signals and generating, by the at least one processor, image data in a k-space according to the MR signals. The method may also include classifying, by the at least one processor, the image data in the k-space into a plurality of phases. Each of the plurality of phases may have a first count of spokes, and a spoke may be defined by a trajectory for filling the k-space. The method may also include classifying, by the at least one processor, the plurality of phases of the image data in the k-space into a plurality of groups. Each of the plurality of groups may include at least one of the plurality of phases of the image data in the k-space. The method may also include determining, by the at least one processor, reference images based on the plurality of groups. Each of the reference images may correspond to the at least one of the plurality of phases of the image data in the k-space. The method may also include reconstructing, by the at least one processor, an image sequence based on the reference images and the plurality of phases of the image data in the k-space.

In some embodiments, the image sequence may include target images, and the method may further include determining a temporal resolution for reconstructing the target images. The method may also include determining a repetition time for acquiring the MR signals and determining, based on the temporal resolution and the repetition time, the first count of spokes. The method may also include classifying, based on the first count of spokes, the image data into the plurality of phases.

In some embodiments, the method may further include determining a first portion of the plurality of phases of the image data. A phase count in the first portion may be equal to a group count of the plurality of groups. The method may also include classifying each of the first portion of the plurality of phases of the image data into one of the plurality of groups. The method may further include classifying each of a second portion of the plurality of phases of the image data into one or more of the plurality of groups.

In some embodiments, for each of the second portion of the plurality of phases, the method may further include determining a first phase of the image data in the first portion that has a minimum distance with the each of the second portion of the plurality of phases of the image data. The method may also include classifying the each of the second portion of the plurality of phases of the image data into a same group to which the first phase of image data belongs.

In some embodiments, the method may further include obtaining a low pass filter and filtering, by the low pass filter, each of the second portion of the plurality of phases of the image data and each of the first portion of the plurality of phases of the image data. The method may also include determining filtered image data of the each of the first portion of the plurality of phases and filtered image data of the each of the second portion of the plurality of phases.

In some embodiments, the method may further include determining a first objective function. The first objective function may include a first component and a second component. The first component may represent a distance between the filtered image data of the each of the second portion of the plurality of phases and filtered image data of one of the first portion of the plurality of phases. The second component may represent a distance between the filtered image data of the each of the second portion of the plurality of phases and filtered image data of a second phase of the first portion of the plurality of phases. The second phase may be adjacent to the one of the first portion of the plurality of phases. The method may also include determining the first phase from the first portion of the plurality of phases based on the first objective function.

In some embodiments, the method may further include determining a plurality of values of the first objective function. Each of the plurality of values may correspond to one of the first portion of the plurality of phases of the image data. The method may also include determining a minimum value from the plurality of values of the first objective function and determining the first phase corresponding to the minimum value from the plurality of values of the first objective function.

In some embodiments, the first objective function may further include a third component representing a distance between the filtered image data of the each of the second portion of the plurality of phases and filtered image data of a third phase of the first portion of the plurality of phases. The third phase may be adjacent to the one of the first portion of the plurality of phases.

In some embodiments, the image sequence may include target images, and the method may further include determining, based on the reference images and the plurality of phases of the image data, a second objective function. The second objective function may include a fidelity component and a first regularization component. The fidelity component may represent a difference between estimated image data in a frequency domain associated with estimated images and the plurality of phases of the image data. The first regularization component may represent a difference between the estimated images and the reference images. The method may also include determining the target images based on the second objective function by performing one or more iterations.

In some embodiments, for each of the plurality of iterations, the method may further include determining, based on the estimated images, a value of the second objective function. The method may also include updating the estimated images and determining the estimated images as the target images until a condition is satisfied.

In some embodiments, the method may further include determining a model configured to transfer the estimated images into the estimated image data in the frequency domain. The model may be associated with a coil sensitivity of the MR scanner. The method may also include determining, based on the model, the fidelity component.

In some embodiments, the second objective function may further include a second regularization component constraining a sparsity of the target images in a frequency domain.

According to another aspect of the present disclosure, a system is provided. The system may include a magnetic imaging (MR) scanner and a computing device. The computing device may include at least one processor and at least one storage device. The at least one storage device may store executable instructions. The at least one processor may be in communication with the at least one storage device, when executing the executable instructions, causing the system to acquire, by the MR scanner, MR signals and generate, by the at least one processor, image data in a k-space according to the MR signals. The at least one processor may cause the system to classify, by the at least one processor, the image data in the k-space into a plurality of phases. Each of the plurality of phases may have a first count of spokes, and a spoke may be defined by a trajectory for filling the k-space. The at least one processor may cause the system to classify, by the at least one processor, the plurality of phases of the image data in the k-space into a plurality of groups. Each of the plurality of groups may include at least one of the plurality of phases of the image data in the k-space. The at least one processor may cause the system to determine, by the at least one processor, reference images based on the plurality of groups. Each of the reference images may correspond to the at least one of the plurality of phases of the image data in the k-space. The at least one processor may cause the system to reconstruct, by the at least one processor, an image sequence based on the reference images and the plurality of phases of the image data in the k-space.

In some embodiments, the at least one processor may further cause the system to determine a first portion of the plurality of phases of the image data. A phase count in the first portion may be equal to a group count of the plurality of groups. The at least one processor may also cause the system to classify each of the first portion of the plurality of phases of the image data into one of the plurality of groups. The at least one processor may also cause the system to classify each of a second portion of the plurality of phases of the image data into one or more of the plurality of groups.

In some embodiments, for each of the second portion of the plurality of phases, the at least one processor may further cause the system to determine a first phase of the image data in the first portion that has a minimum distance with the each of the second portion of the plurality of phases of the image data. The at least one processor may also cause the system to classify the each of the second portion of the plurality of phases of the image data into a same group to which the first phase of image data belongs.

In some embodiments, the at least one processor may further cause the system to obtain a low pass filter. The at least one processor may also cause the system to filter, by the low pass filter, each of the second portion of the plurality of phases of the image data and each of the first portion of the plurality of phases of the image data. The at least one processor may also cause the system to determine filtered image data of the each of the first portion of the plurality of phases and filtered image data of the each of the second portion of the plurality of phases.

In some embodiments, the at least one processor may further cause the system to determine a first objective function. The first objective function may include a first component and a second component. The first component may represent a distance between the filtered image data of the each of the second portion of the plurality of phases and filtered image data of one of the first portion of the plurality of phases. The second component may represent a distance between the filtered image data of the each of the second portion of the plurality of phases and filtered image data of a second phase of the first portion of the plurality of phases. The second phase may be adjacent to the one of the first portion of the plurality of phases. The at least one processor may also cause the system to determine the first phase from the first portion of the plurality of phases based on the first objective function.

In some embodiments, the image sequence may include target images, and the at least one processor may further cause the system to determine, based on the reference images and the plurality of phases of the image data, a second objective function. The second objective function may include a fidelity component and a first regularization component. The fidelity component may represent a difference between estimated image data in a frequency domain associated with estimated images and the plurality of phases of the image data. The first regularization component may represent a difference between the estimated images and the reference images. The at least one processor may also cause the system to determine the target images based on the second objective function by performing one or more iterations.

In some embodiments, the second objective function may further include a second regularization component constraining a sparsity of the target images in a frequency domain.

According to another aspect of the present disclosure, a non-transitory computer readable medium may store at least one set of instructions. When executed by at least one processor, the at least one set of instructions may direct the at least one processor to perform acts of: acquiring, by an MR scanner, MR signals; generating, by the at least one processor, image data in a k-space according to the MR signals; classifying, by the at least one processor, the image data in the k-space into a plurality of phases, each of the plurality of phases having a first count of spokes, a spoke being defined by a trajectory for filling the k-space; classifying, by the at least one processor, the plurality of phases of the image data in the k-space into a plurality of groups, each of the plurality of groups including at least one of the plurality of phases of the image data in the k-space; determining, by the at least one processor, reference images based on the plurality of groups, each of the reference images corresponding to the at least one of the plurality of phases of the image data in the k-space; and reconstructing, by the at least one processor, an image sequence based on the reference images and the plurality of phases of the image data in the k-space.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but is to be accorded the widest scope consistent with the claims.

It will be understood that the term "system," "engine," "unit," "module," and/or "block" used herein are one method to distinguish different components, elements, parts, section or assembly of different level in ascending order. However, the terms may be displaced by another expression if they may achieve the same purpose.

Figure 2:
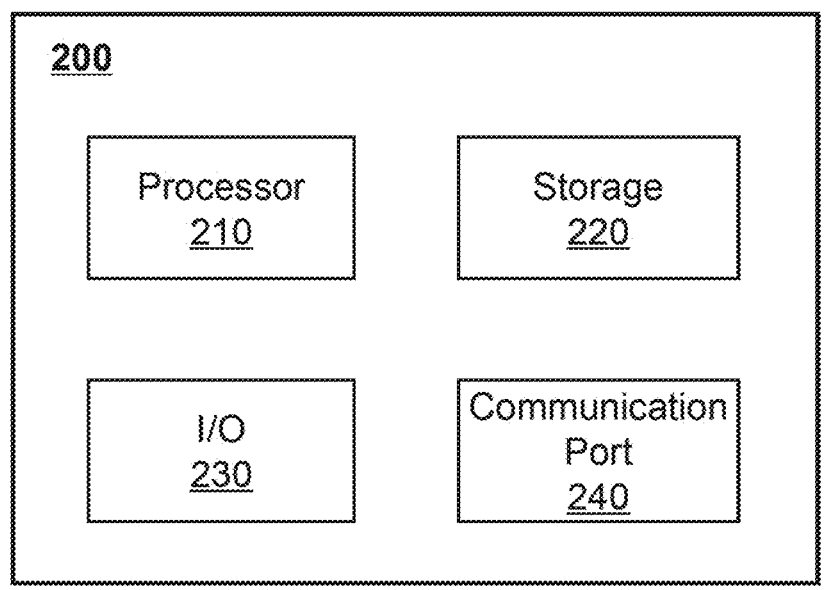
FIG. 2 is a schematic diagram illustrating hardware and/or software components of an exemplary computing device on which the processing engine may be implemented according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 220 as illustrated in FIG. 2) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an Erasable Programmable Read Only Memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts The present disclosure relates to methods and systems for MR image reconstruction. The method may include obtaining image data in a k-space using a radial sampling technique based on magnetic resonance (MR) signals acquired by an MR scanner. The method may also include classifying the image data into a plurality of phases. Each phase may have a number of spokes, and each of the spokes may be defined by a trajectory for filling the k-space. Further, the method may include classifying the plurality of phases into a plurality of groups. The method may also include determining reference images based on the plurality of groups. The method may include reconstructing an image sequence based on the reference images and the image data in the k-space.

Figure 1:
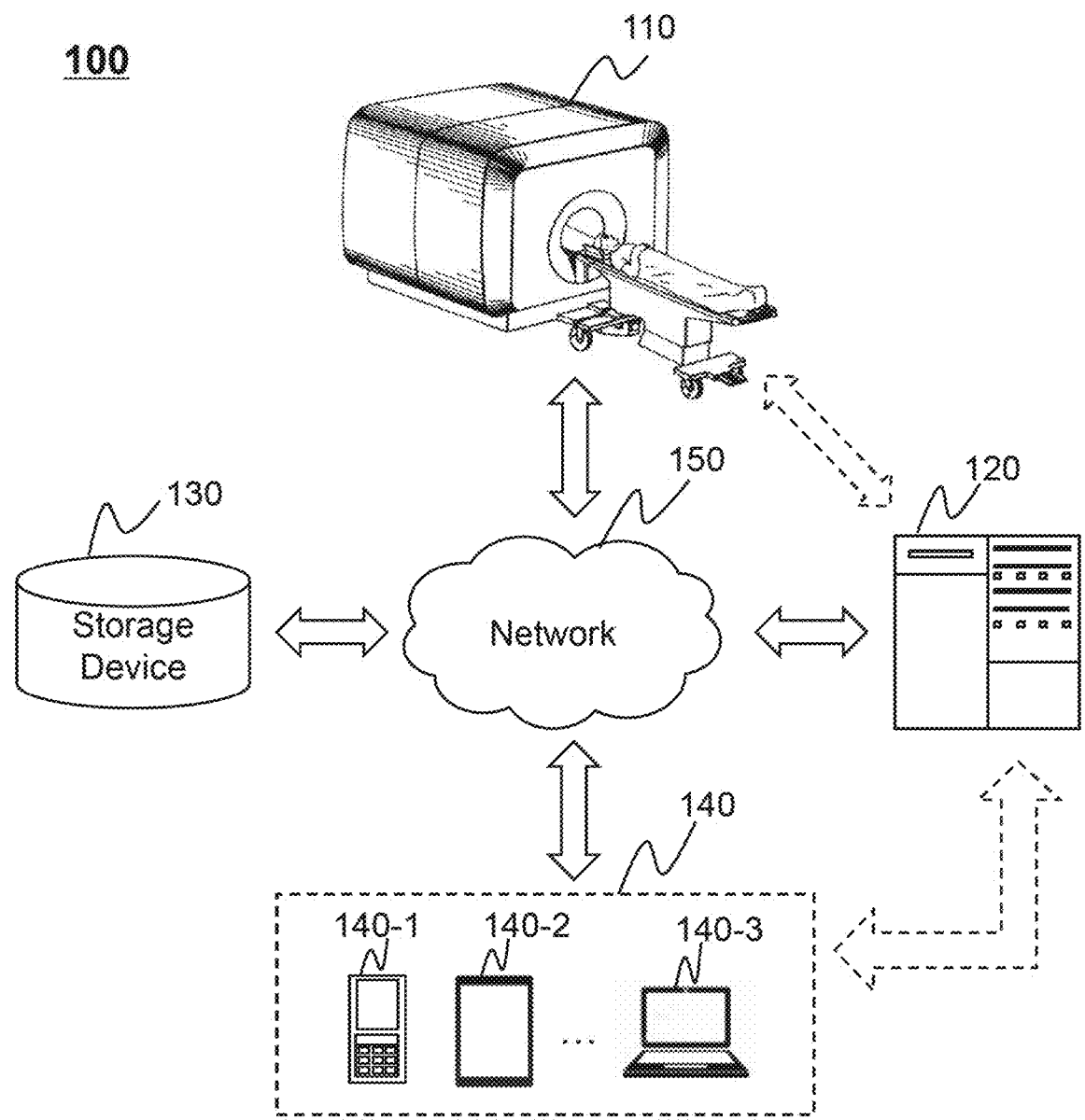
FIG. 1 is a schematic diagram illustrating an exemplary magnetic resonance imaging (MRI) system according to some embodiments of the present disclosure.

FIG. 1 is a schematic diagram illustrating an exemplary magnetic resonance imaging (MRI) system 100 according to some embodiments of the present disclosure. As illustrated, the MRI system 100 may include an MR scanner 110, a processing device 120, a storage device 130, one or more terminals 140, and a network 150. The components in the MRI system 100 may be connected in one or more of various ways. Merely by way of example, as illustrated in FIG. 1, the MR scanner 110 may be connected to the processing device 120 through the network 150. As another example, the MR scanner 110 may be connected with the processing device 120 directly as indicated by the bi-directional arrow in dotted lines linking the MRI scanner and the processing device 120. As a further example, the storage device 130 may be connected with the processing device 120 directly (not shown in FIG. 1) or through the network 150. As still a further example, one or more terminal(s) 140 may be connected with the processing device 120 directly (as indicated by the bi-directional arrow in dotted lines linking the terminal(s) 140 and the processing device 120) or through the network 150.

The MR scanner 110 may scan a (part of) subject or locate within its detection region and generate MR signals relating to the (part of) subject. In the present disclosure, the terms "subject" and "object" are used interchangeably. In some embodiments, the subject may include a body, a substance, or the like, or a combination thereof. In some embodiments, the subject may include a specific portion of a body, such as the head, the thorax, the abdomen, or the like, or a combination thereof. In some embodiments, the subject may include a specific organ, such as the heart, the esophagus, the trachea, the bronchus, the stomach, the gallbladder, the small intestine, the colon, the bladder, the ureter, the uterus, the fallopian tube, etc. The MR scanner 110 may include a magnet assembly, a gradient coil assembly, and a radiofrequency (RF) coil assembly.

The magnet assembly may generate a first magnetic field (also referred to as a main magnetic field) for polarizing the subject to be scanned. The magnet assembly may include a permanent magnet, a superconducting electromagnet, a resistive electromagnet, etc.

The gradient coil assembly may generate a second magnetic field (also referred to as a gradient magnetic field). The gradient coil assembly may include X-gradient coils, Y-gradient coils, and Z-gradient coils. The gradient coil assembly may generate one or more magnetic field gradient pulses to the main magnetic field in the X direction (Gx), Y direction (Gy), and Z direction (Gz) to encode the spatial information of the subject. In some embodiments, the X direction may be designated as a frequency encoding direction, while the Y direction may be designated as a phase encoding direction. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data. In some embodiments, Gz may be used for phase encoding for obtaining 3D k-space data.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated according to a pulse sequence. The RF receiver coils may acquire MR signals from the subject according to the pulse sequence. The pulse sequence may be defined by imaging parameters and arrangement associated with the image parameters in time sequence. In some embodiments, the image parameters may include parameters (e.g., the number of excitations (NEX), a bandwidth, etc.) relating to a RF pulse emitted by the RF coil, parameters (e.g., a gradient direction, a duration for applying a gradient, etc.) relating to gradient fields generated by the gradient coil, parameters relating to the MR signals (e.g., an echo time (TE), echo train length (ETL), etc.). In some embodiments, the pulse sequence may be defined by one or more parameters relating to time, such as a repetition time (TR), an acquisition time (TA), etc. The MR signals may also be referred to as echo signals. The MR signals may be used to fill a k-space based on a sampling technique. Exemplary sampling techniques may include a Cartesian sampling technique, a spiral sampling technique, a radial sampling technique, a Z-sampling technique, an undersampling technique, etc. Take the radial sampling technique as an example, the k-space may be filled based on the MR signals according to a plurality of radial trajectories. A trajectory for filling the k-space may also be referred to as a spoke. The plurality of spokes may have a center point. The plurality of spokes may be spaced by a preset azimuthal increment which may cause the spokes to be spaced with a constant time. Additionally, the plurality of spokes may rotate within a preset time interval by a preset angle (e.g., 111.25°).

In some embodiments, one or more RF coils may both transmit RF pulses and receive MR signals at different times. In some embodiments, the function, size, type, geometry, position, amount, and/or magnitude of the RF coil(s) may be determined or changed according to one or more specific conditions. For example, according to the difference in function and size, the RF coil(s) may be classified as volume coils and local coils. In some embodiments, an RF receiver coil may correspond to a channel for acquiring MR signals. The RF receiver coils may receive a plurality of channels of MR signals from the subject. An RF receiver coil may correspond to a coil sensitivity. As used herein, the coil sensitivity of an RF receiver coil refers to the response degree of the RF receiver coil for receiving an input signal (e.g., an MR signal). An intensity of the input signal (e.g., an MR signal) may be attenuated with the distance between the RF receiver coil and a subject generating the MR signal. In some embodiments, the higher the sensitivity degree of the RF receiver coil is, the farther the input signal may be attenuated to a constant (e.g., 0, a half intensity of the input signal, etc.). In some embodiments, the coil sensitivities of the RF receiver coils in the MR scanner 110 may be the same or different. The coil sensitivities of the RF receiver coils may have a sensitivity distribution, which may be denoted by a sensitivity function. More descriptions for the sensitivity function may be found elsewhere in the present disclosure (e.g., FIG. 6 and the descriptions thereof).

The received MR signal(s) may be sent to the processing device 120 directly or via the network 150 for image reconstruction and/or image processing. In some embodiments, the MRI scanner 110 may include an analog-to-digital converter (ADC) (not shown in FIG. 1). The analog-to-digital converter may convert MR signals received by one or more RF receiver coils into MR image data. The analog-to-digital converter may be a direct-conversion ADC, a successive-approximation ADC, a ramp-compare ADC, a Wilkinson ADC, an integrating ADC, a delta-encoded ADC, a pipeline ADC, a sigma-delta ADC, or the like, or a combination thereof.

The processing device 120 may process data and/or information obtained from the MR scanner 110, the terminal(s) 140, and/or the storage device 130. For example, the processing device 120 may obtain image data in a k-space based on the MR signals of one or more channels obtained from the MR scanner 110. As another example, the processing device 120 may process the image data in the k-space and reconstruct an image sequence of the subject. In some embodiments, the reconstructed image may be transmitted to the terminal(s) 140 and displayed on one or more display devices in the terminal(s) 140. In some embodiments, the processing device 120 may be a single server or a server group. The server group may be centralized or distributed. In some embodiments, the processing device 120 may be local or remote. For example, the processing device 120 may access information and/or data stored in the MR scanner 110, the terminal(s) 140, and/or the storage device 130 via the network 150. As another example, the processing device 120 may be directly connected with the MR scanner 110, the terminal(s) 140, and/or the storage device 130 to access stored information and/or data. In some embodiments, the processing device 120 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 120 may be implemented on a computing device 200 having one or more components illustrated in FIG. 2 in the present disclosure.

The storage device 130 may store data and/or instructions. In some embodiments, the storage device 130 may store data obtained from the terminal(s) 140 and/or the processing device 120. For example, the storage device 130 may store MR signals obtained from the MR scanner 110 and image data in a k-space determined based on the MR signals. As another example, the storage device 130 may store an image sequence of a subject, which may be reconstructed based on the image data in the k-space. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected with the network 150 to communicate with one or more components of the MRI system 100 (e.g., the processing device 120, the terminal(s) 140, etc.). One or more components of the MRI system 100 may access the data or instructions stored in the storage device 130 via the network 150. In some embodiments, the storage device 130 may be directly connected with or communicate with one or more components of the MRI system 100 (e.g., the processing device 120, the terminal(s) 140, etc.). In some embodiments, the storage device 130 may be part of the processing device 120.

The terminal(s) 140 may include a mobile device 140-1, a tablet computer 140-2, a laptop computer 140-3, or the like, or any combination thereof. In some embodiments, the mobile device 140-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smartwatch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass, an Oculus Rift, a Hololens, a Gear VR, etc. In some embodiments, the terminal(s) 140 may remotely operate the MR scanner 110. In some embodiments, the terminal(s) 140 may operate the MR scanner 110 via a wireless connection. In some embodiments, the terminal(s) 140 may receive information and/or instructions inputted by a user, and send the received information and/or instructions to the MR scanner 110 or the processing device 120 via the network 150. In some embodiments, the terminal(s) 140 may receive data and/or information from the processing device 120. In some embodiments, the terminal(s) 140 may be part of the processing device 120. In some embodiments, the terminal(s) 140 may be omitted.

The network 150 may include any suitable network that can facilitate the exchange of information and/or data for the MRI system 100. In some embodiments, one or more components of the MRI system 100 (e.g., the MR scanner 110, the terminal(s) 140, the processing device 120, or the storage device 130) may communicate information and/or data with one or more other components of the MRI system 100 via the network 150. For example, the processing device 120 may obtain MR signals from the MR scanner 110 via the network 150. As another example, the processing device 120 may obtain user instructions from the terminal(s) 140 via the network 150. In some embodiments, the network 150 may be any type of wired or wireless network, or a combination thereof. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected with the network 150 to exchange data and/or information.

The network 150 may include any suitable network that can facilitate the exchange of information and/or data for the MRI system 100. In some embodiments, one or more components of the MRI system 100 (e.g., the MR scanner 110, the terminal(s) 140, the processing device 120, the storage device 130, etc.) may transmit or receive information and/or data with one or more other components of the MRI system 100 via the network 150. For example, the processing device 120 may obtain image data from the MR scanner 110 via the network 150. As another example, the processing device 120 may obtain user instructions from the terminal(s) 140 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, witches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected with the network 150 to exchange data and/or information.

FIG. 2 is a schematic diagram illustrating hardware and/or software components of an exemplary computing device 200 on which the processing device 120 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program code) and perform functions of the processing device 120 in accordance with techniques described herein. The computer instructions may include, for example, routines, programs, objects, components, signals, data structures, procedures, modules, and functions, which perform particular functions described herein. For example, the processor 210 may process data obtained from the MR scanner 110, the terminal(s) 140, the storage device 130, and/or any other component of the MRI system 100. Specifically, the processor 210 may process one or more measured data sets obtained from the MR scanner 110. For example, the processor 210 may perform one-dimensional (1D) correction or two-dimensional (2D) correction for the measured data set(s). The processor 210 may reconstruct an image based on the corrected data set(s). In some embodiments, the reconstructed image may be stored in the storage device 130, the storage 220, etc. In some embodiments, the reconstructed image may be displayed on a display device by the I/O 230. In some embodiments, the processor 210 may perform instructions obtained from the terminal(s) 140. In some embodiments, the processor 210 may include one or more hardware processors, such as a microcontroller, a microprocessor, a reduced instruction set computer (RISC), an application-specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both process A and process B, it should be understood that process A and process B may also be performed by two or more different processors jointly or separately in the computing device 200 (e.g., a first processor executes process A and a second processor executes process B, or the first and second processors jointly execute processes A and B).

The storage 220 may store data/information obtained from the MR scanner 110, the terminal(s) 140, the storage device 130, or any other component of the MRI system 100. In some embodiments, the storage 220 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 120 for reducing or removing one or more artifacts in an image.

The I/O 230 may input or output signals, data, and/or information. In some embodiments, the I/O 230 may enable user interaction with the processing device 120. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected with a network (e.g., the network 120) to facilitate data communications. The communication port 240 may establish connections between the processing device 120 and the MR scanner 110, the terminal(s) 140, or the storage device 130. The connection may be a wired connection, a wireless connection, or combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
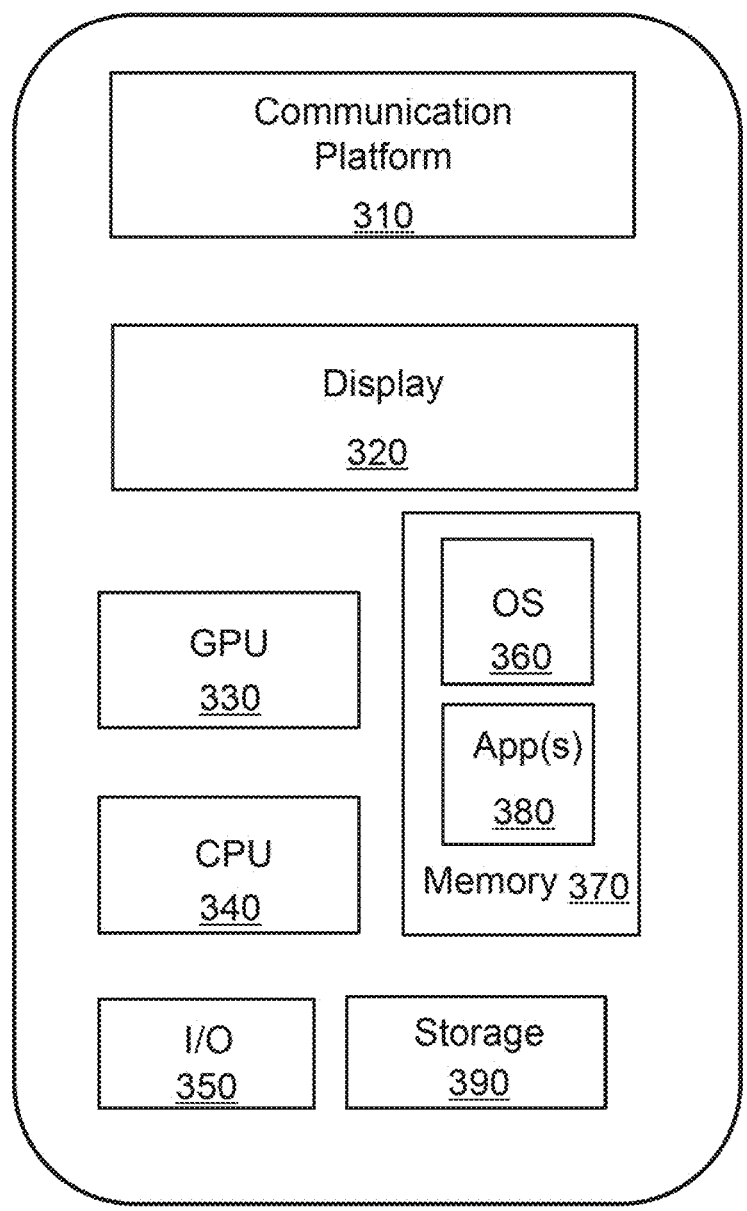
FIG. 3 is a schematic diagram illustrating hardware and/or software components of an exemplary mobile device according to some embodiments of the present disclosure.

FIG. 3 is a schematic diagram illustrating hardware and/or software components of an exemplary mobile device 300 according to some embodiments of the present disclosure. As illustrated in FIG. 3, the mobile device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 120. User interactions with the information stream may be achieved via the I/O 350 and provided to the processing device 120 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate an image with reduced Nyquist ghost artifact as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result, the drawings should be self-explanatory.

Figure 4:
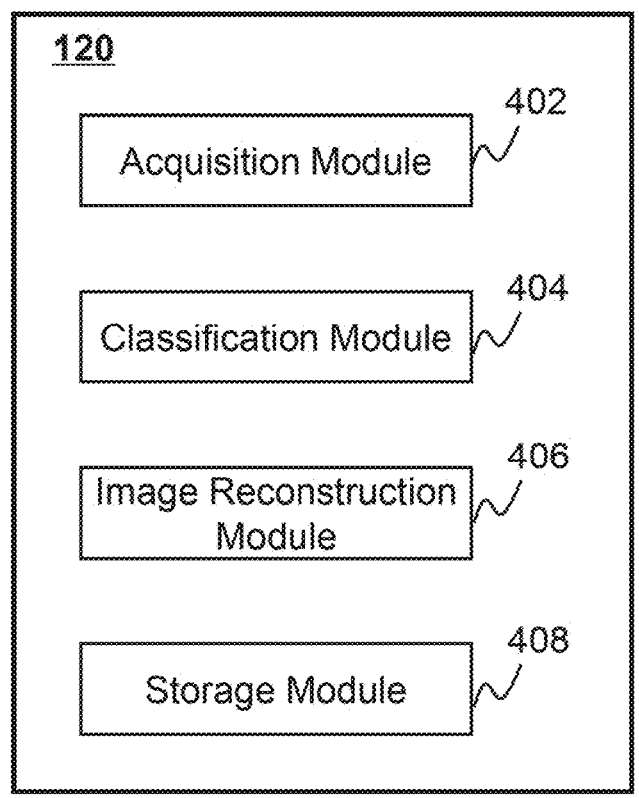
FIG. 4 is a block diagram illustrating an exemplary processing engine according to some embodiments of the present disclosure.

FIG. 4 is a block diagram illustrating an exemplary processing engine according to some embodiments of the present disclosure. The processing device 120 may include an acquisition module 402, a classification module 404, an image reconstruction module 406, and a storage module 408. At least a portion of the processing device 120 may be implemented on a computing device as illustrated in FIG. 2 or a mobile device as illustrated in FIG. 3.

The acquisition module 402 may obtain image data in a K-space. The image data in the k-space may be associated with magnetic resonance (MR) signals acquired by an MR scanner (e.g., the MR scanner 110) scanning a subject (e.g., a substance, an organ, a tissue, etc.). The image data in the k-space may be determined by filling the k-space using the MR signals according to a plurality of radial trajectories (e.g., the lines illustrated in FIG. 8B). A trajectory for filling the k-space may also be referred to as a spoke. Each of the MR signals may correspond to a spoke of the image data in the k-space. The total number of the plurality of spokes may be set by a user (e.g., a doctor or an operator) according to a clinical demand or a default setting of the MRI system 100.

The classification module 404 may classify the image data in the k-space into a plurality of phases. Each of the plurality of phases of the image data in the k-space may be enough to reconstruct an image relating to a subject. A phase of the image data in the k-space may have a first count of spokes. As used herein, the first count of spokes of a phase refers to the number of spokes corresponding to that phase. In some embodiments, each of the plurality of phases of the image data in the k-space may have the same first count of spokes. In some embodiments, one or more of the plurality of phases of the image data in the k-space may have a different first count of spokes from each other. Accordingly, the classification module 404 may classify the image data in the k-space into the plurality of phases based on the first count of spokes.

The classification module 404 may further classify the plurality of phases of the image data in the k-space into a plurality of groups. In some embodiments, the total number of the plurality of groups (also referred to as the total group count) may be less than the total number of the plurality of phases (also referred to as the total phase count). The total number of the plurality of groups may be set by a user (e.g., an operator) or according to a default setting of the MRI system 100. In some embodiments, each of the plurality of groups may have the same phase count. In some embodiments, each of the plurality of groups may have different phase counts.

In some embodiments, the classification module 404 may classify the plurality of phases of the image data into the plurality of groups based on a similarity between two phases of the image data. The similarity between two phases of the image data may be represented by the distance between the two phases of the image data. The smaller the distance is, the higher the similarity may be. Exemplary distances for representing a similarity may include a Minkowski distance, a Euclidean distance, a Manhattan distance, a Chebyshev distance, etc. The classification module 404 may classify the phase of the image data and one of the other phases of the image data having the maximum similarity into the same group.

In some embodiments, the classification module 404 may classify the plurality of phases of the image data into a first portion of the plurality of phases of the image data and a second portion of the plurality of phases of the image data. The first portion of the plurality of phases of the image data may have a first phase count, also referred to as the number of the first portion of the plurality of phases. The second portion of the plurality of phases of the image data may have a second phase count, also referred to as the number of the second portion of the plurality of phases. In some embodiments, the first phase count may be smaller than or equal to the second phase count. In some embodiments, the first phase count may be greater than the second phase count. The first phase count may be equal to the total number of the plurality of groups. The classification module 404 may classify each of the first portions of the plurality of phases of the image data into one of the plurality of groups. As used herein, the first portion of the plurality of phases of the image data may also be referred to as reference phases of the image data. The classification module 404 may classify each of the second portion of the plurality of phases of the image data into one of the plurality of groups. For example, a reference phase of the image data in the first portion may be determined which has a minimum distance with the each of the second portion of the plurality of phases of the image data. The classification module 404 may classify the each of the second portion of the plurality of phases of the image data into the same group to which the reference phase of the image data belongs.

In some embodiments, before the plurality of phases of the image data in the k-space are classified, the classification module 404 may filter the image data in the k-space using a low pass filter to obtain the filtered image data in the k-space. The classification module 404 may classify the plurality of phases of the image data in the k-space based on the plurality of the filtered image data. The low pass filter may be configured to filter out at least one portion of the image data in the k-space having frequencies greater than a frequency threshold.

The image reconstruction module 406 may determine reference images based on the plurality of groups of the image data. The image reconstruction module 406 may reconstruct the reference images based on all or a portion of the plurality of groups of image data. The number of the reference images may be equal to or less than the total number of the plurality of groups. Each of the reference images may correspond to one or more phases of the image data in one of the plurality of groups.

In some embodiments, the image reconstruction module 406 may reconstruct the reference images using an image reconstruction technique. Exemplary reconstruction techniques may include a 2-dimensional Fourier transform technique, a back projection technique (e.g., a convolution back projection technique, a filtered back projection technique), an iteration technique, etc. Exemplary iteration techniques may include an algebraic reconstruction technique (ART), a simultaneous iterative reconstruction technique (SIRT), a simultaneous algebraic reconstruction technique (SART), an adaptive statistical iterative reconstruction (ASIR) technique, a model-based iterative reconstruction (MBIR) technique, a sinogram affirmed iterative reconstruction (SAFIR) technique, or the like, or any combination thereof.

The reconstruction module 406 may further reconstruct an image sequence including a plurality of target images based on the reference images and the plurality of phases of the image data in the k-space. As used herein, the plurality of target images may be reconstructed using an iteration technique. For example, the reconstruction module 406 may determine the plurality of target images by performing one or more iterations based on an objective function. The objection function may be constructed based on the reference images. In some embodiments, the objective function may include a fidelity component, a first regularization component, a second regularization component, or the like, or any combination thereof. The fidelity component may represent a difference between estimated image data in a frequency domain associated with estimated images and the plurality of phases of the image data. The first regularization component may represent a difference between the estimated images and the reference images. The first regularization component may be configured to constrain the difference between the target images and the reference images. The second regularization component may be configured to constrain a sparsity of each of the target images in a frequency domain.

In some embodiments, the image reconstruction module 406 may determine an optimal solution (e.g., the image sequence) of the objective function based on a conjugate gradient descent technique, a simulated annealing technique, a Bregman technique, a Fixed-point Continuation (FPC) technique, a L1-magic technique, a L1-Ls technique, a Newton descent technique, a genetic technique, or the like, or any combination thereof.

The storage module 408 may store information. The information may include programs, software, algorithms, data, text, number, images and some other information. For example, the information may include image data in a k-space, a plurality of phases of the image data in the k-space, a plurality of groups of the image data in the k-space, reference images, an image sequence including target images, etc.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 5:
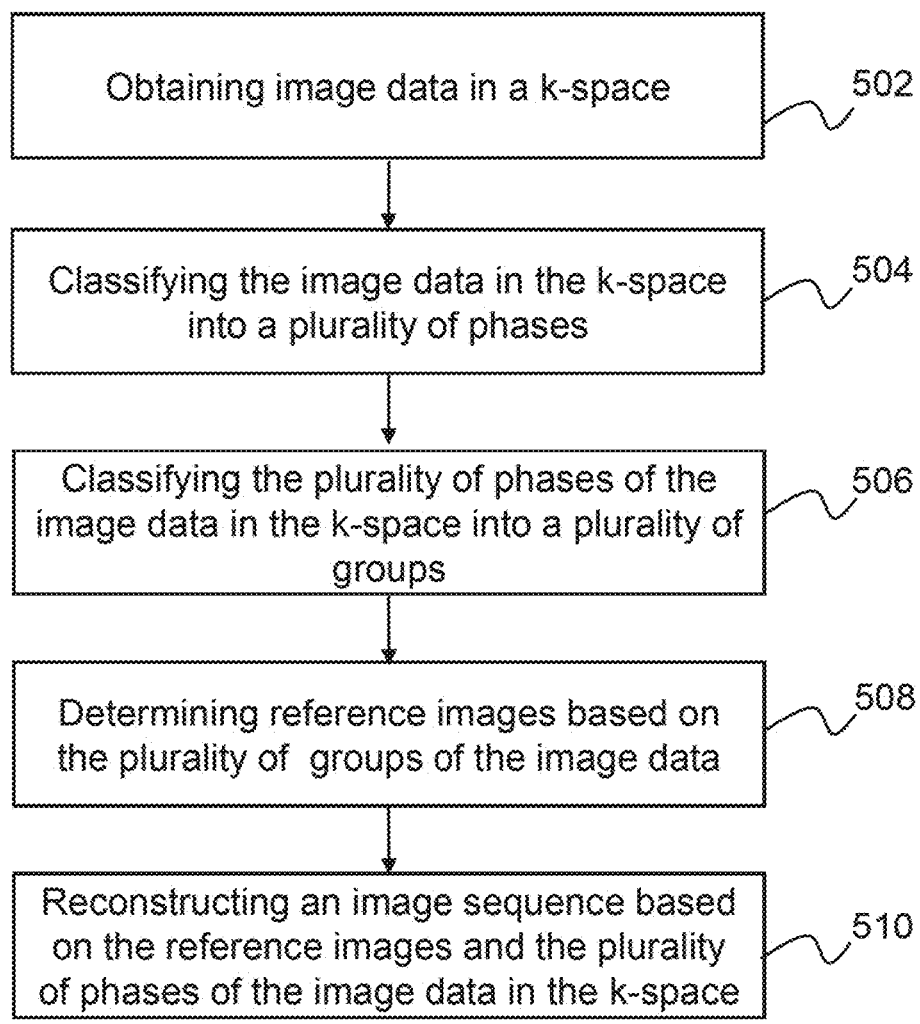
FIG. 5 is a flowchart illustrating an exemplary process for reconstructing an image sequence including target images according to some embodiments of the present disclosure.

FIG. 5 is a flowchart illustrating an exemplary process for reconstructing an image sequence including target images according to some embodiments of the present disclosure. In some embodiments, one or more operations of process 500 illustrated in FIG. 5 may be implemented in the MRI system 100 illustrated in FIG. 1. For example, process 500 illustrated in FIG. 5 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3).

In 502, image data in a K-space may be obtained. Operation 502 may be performed by the acquisition module 402. The image data in the k-space may be associated with magnetic resonance (MR) signals acquired by an MR scanner (e.g., the MR scanner 110) scanning a subject (e.g., a substance, an organ, a tissue, etc.). In some embodiments, the image data in the k-space may be generated by filling the k-space using the MR signals according to a plurality of radial trajectories (e.g., the lines illustrated in FIG. 8B). A trajectory for filling the k-space may also be referred to as a spoke. Each of the MR signals may correspond to a spoke of the image data in the k-space. The total number of the plurality of spokes may be set by a user (e.g., a doctor or an operator) according to a clinical demand or a default setting of the MRI system 100.

Figure 8A:
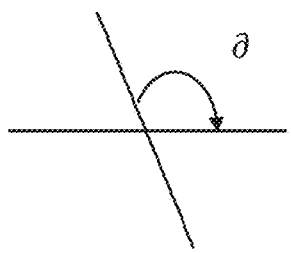
FIG. 8A is a schematic diagram illustrating an exemplary angle between two adjacent spokes in a k-space according to some embodiments of the present disclosure.
Figure 8B:
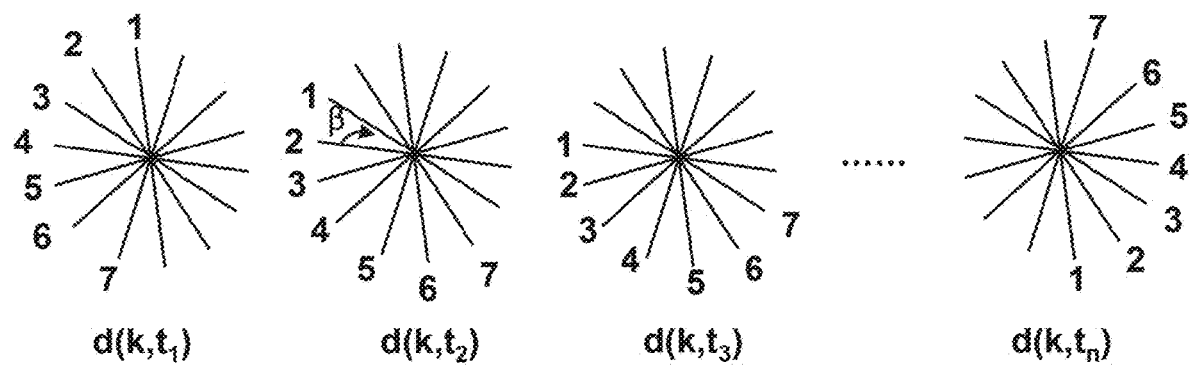
FIG. 8B is a schematic diagram illustrating exemplary spokes in a k-space according to some embodiments of the present disclosure.

In some embodiments, the plurality of spokes may have a center point (point "A" as illustrated in FIG. 8B). The plurality of spokes may be spaced by a preset azimuthal increment (∂ illustrated in FIG. 8A, e.g., 111.25°), and the plurality of spokes may be spaced with a constant time accordingly. Additionally, the plurality of spokes may rotate within a preset time interval by a preset angle (e.g., 111.25°). Each of the plurality of spokes may have a plurality of data points. The plurality of data points may represent the each of the plurality of spokes of the image data in the k-space associated with one of the MR signals. The brightness of a data point may represent a relative contribution of the data point's unique spatial frequency to a target image reconstructed based on at least one portion of the image data in the k-space. In some embodiments, a portion of the plurality of data points may be not filled based on one of the MR signals. The portion of the plurality of the data points may be filled with zero.

The plurality of spokes may correspond to a plurality of acquisition time points respectively. Accordingly, the plurality of spokes may be ordered based on the acquisition time points. In some embodiments, the plurality of spokes of the image data in the k-space may be expressed as a first ordered set denoted by Equation (1) illustrated below:

$$S=[S_1, S_2, S_i, \ldots, S_m] \quad (1),$$

where S refers to the first ordered set, $S_i$ refers to an $i^{th}$ spoke, and m refers to the total number of the plurality of spokes. In the first ordered set, the plurality of spokes may be ordered in chronological order based on acquisition time points of the plurality of spokes. For example, the spoke $S_1$ may correspond to a first acquisition time point and the spoke $S_2$ may correspond to a second acquisition time point. The second acquisition time point may be later than the first acquisition time point. The time interval between two adjacent spokes of the image data (e.g., the spoke $S_1$ and the spoke $S_2$) may be associated with the time interval between two adjacent MR signals. The time interval between two adjacent MR signals may be associated with a repetition time (TR) of a pulse sequence for acquiring the MR signals. The repetition time (TR) of the pulse sequence for acquiring the MR signals may be set by a user (e.g., a doctor or an operator) according to a clinical demand or a default setting of the MRI system 100.

In 504, the image data in the k-space may be classified into a plurality of phases. Operation 504 may be performed by the classification module 404. Each of the plurality of phases of the image data in the k-space may be enough to reconstruct an image relating to a subject. A phase of the image data in the k-space may have a first count of spokes. As used herein, the first count of spokes of a phase refers to the number of spokes corresponding to that phase. In some embodiments, each of the plurality of phases of the image data in the k-space may have the same first count of spokes. In some embodiments, one or more of the plurality of phases of the image data in the k-space may have a different first count of spokes from each other. Accordingly, the image data in the k-space may be classified into the plurality of phases based on the first count of spokes. For example, if the total number of the plurality of spokes is 120 (e.g., $S_1$, $S_2, \ldots, S_{120}$), and the first count of spokes for each of the plurality of phases of the image data is 30, the image data in the k-space may be classified into 4 phases including ($S_1$, $S_2, \ldots, S_{30}$), ($S_{31}, S_{32}, \ldots, S_{60}$), ($S_{61}, S_{62}, \ldots, S_{90}$), and ($S_{91}, S_{92}, \ldots, S_{120}$).

In some embodiments, the first count of spokes may be set by a user (e.g., a doctor) or according to a default setting of the MRI system 100. For example, the first count of spokes may be an integer within a range from 21 to 55. In some embodiments, the first count of spokes may be determined based on a temporal resolution associated with image reconstruction and a repetition time (TR) of a pulse sequence for acquiring the MR signals. As used herein, the temporal resolution refers to a time duration for acquiring a portion of the MR signals, which may be enough to reconstruct an image. The temporal resolution may be consistent with the time duration for acquiring each of the plurality of phases of the image data. In some embodiments, the temporal resolution may be set by a user (e.g., a doctor) or according to a default setting of the MRI system 100. For example, the temporal resolution may be 30 ms, 40 ms, or 50 ms. The repetition time of the pulse sequence refers to a time duration for performing the pulse sequence for one time. For example, the repetition time of a spin echo sequence may be equal to the time interval between two successive RF pulses. The repetition time may be consistent with the time interval for acquiring a spoke of the image data in the k-space. Therefore, the first count of spokes may be a ratio of the temporal resolution to the repetition time denoted by Equation (2) as follows:

$$N=\lfloor t/TR \rfloor \quad (2),$$

where N refers to a first count of spokes, t refers to temporal resolution, and TR refers to repetition time.

The plurality of phases of the image data in the K-space may be set in chronological order. In some embodiments, the plurality of phases of the image data in the k-space may be expressed as a second ordered set denoted by Equation (3) as follows:

$$K=[d(k,t_1), d(k,t_2), \ldots, d(k,t_i), \ldots, d(k,t_n)] \quad (3),$$

where K refers to the second ordered set of the plurality of phases of the image data, $d(k,t_i)$ refers to an $i^{th}$ phase of the image data in the k-space, and n refers to a total phase count of the plurality of phases of the image data in the k-space, also referred to as the total number of the plurality of phases. In the second ordered set, the plurality of phases of the image data may be ordered in chronological order. More descriptions for the plurality of phases of the image data may be found elsewhere in the present disclosure (e.g., FIG. 8B and the descriptions thereof).

In 506, the plurality of phases of the image data in the k-space may be classified into a plurality of groups. Operation 506 may be performed by the classification module 404. In some embodiments, the total number of the plurality of groups (also referred to as the total group count) may be less than the total number of the plurality of phases (also referred to as the total phase count). The total number of the plurality of groups may be set by a user (e.g., an operator) or according to a default setting of the MRI system 100. For example, the total number of the plurality of groups may be a number in the range of 10 to 40, 20 to 30, etc. In some embodiments, each of the plurality of groups may have the same phase count. In some embodiments, each of the plurality of groups may have different phase counts.

In some embodiments, the classification module 404 may classify the plurality of phases of the image data into the plurality of groups based on a similarity between two phases of the image data. For example, the classification module 404 may determine the similarity between two phases of the image data. If the classification module 404 determines that the similarity between two phases of the image data (which may be represented by the distance between the two phases of the image data) is greater than a threshold (a threshold distance), the classification module 404 may classify the two phases of the image data into the same group. The similarity between two phases of the image data may be represented by the distance between the two phases of the image data. The smaller the distance is, the higher the similarity may be. Exemplary distances for representing a similarity may include a Minkowski distance, a Euclidean distance, a Manhattan distance, a Chebyshev distance, etc. As another example, the classification module 404 may determine similarities between a phase of the image data and other phases of the image data. The classification module 404 may classify the phase of the image data and one of the other phases of the image data having the maximum similarity into the same group.

In some embodiments, the classification module 404 may classify the plurality of phases of the image data into a first portion of the plurality of phases of the image data and a second portion of the plurality of phases of the image data. The first portion of the plurality of phases of the image data may have a first phase count, also referred to as the number of the first portion of the plurality of phases. The second portion of the plurality of phases of the image data may have a second phase count, also referred to as the number of the second portion of the plurality of phases. In some embodiments, the first phase count may be smaller than or equal to the second phase count. In some embodiments, the first phase count may be greater than the second phase count. The first phase count may be equal to the total number of the plurality of groups. The classification module 404 may classify each of the first portions of the plurality of phases of the image data into one of the plurality of groups. For example, if the first phase count is 15, the total number of the plurality of groups may be 15; i.e., the classification module 404 may classify the plurality of phases of the image data in the k-space into 15 groups. As used herein, the first portion of the plurality of phases of the image data may also be referred to as reference phases of the image data. The classification module 404 may classify each of the second portion of the plurality of phases of the image data into one of the plurality of groups. For example, a reference phase of the image data in the first portion may be determined which has a minimum distance with the each of the second portion of the plurality of phases of the image data. The classification module 404 may classify the each of the second portion of the plurality of phases of the image data into the same group to which the reference phase of the image data belongs.

In some embodiments, before the plurality of phases of the image data in the k-space are classified, the classification module 404 may filter the image data in the k-space using a low pass filter to obtain the filtered image data in the k-space. The classification module 404 may classify the plurality of phases of the image data in the k-space based on the plurality of the filtered image data. For example, the classification module 404 may classify each of the second portion of the plurality of phases of the image data into one of the plurality of groups based on distances between filtered image data of each of the second portion of the plurality of phases and filtered image data of each of the first portion of the plurality of phases. Exemplary low pass filters may include a Butterworth filter, a Chebyshev filter, etc. The low pass filter may be configured to filter out at least one portion of the image data in the k-space having frequencies greater than a frequency threshold. More detailed descriptions of classifying the plurality of phases of the image data in the k-space into the plurality of groups can be found elsewhere in the present disclosure (e.g., FIG. 6 and the descriptions thereof).

In 508, reference images may be determined based on the plurality of groups of the image data. Operation 508 may be performed by the image reconstruction module 406. In some embodiments, each of the plurality of groups of the image data in the k-space may be used to reconstruct the reference images. The number of the reference images may be equal to the total number of the plurality of groups. In some embodiments, one or more groups of the plurality of the groups of the image data in the k-space may be not used to reconstruct the reference images. The number of the reference images may be less than the total number of the plurality of groups. For example, if the image reconstruction module 406 determines that the data quantity in a specific group of the plurality of groups is less than a threshold, the specific group of the image data may be not used to reconstruct the reference images. Each of the reference images may correspond to one or more phases of the image data in one of the plurality of groups.

In some embodiments, the image reconstruction module 406 may reconstruct the reference images using an image reconstruction technique. Exemplary reconstruction techniques may include a 2-dimensional Fourier transform technique, a back projection technique (e.g., a convolution back projection technique, a filtered back projection technique), an iteration technique, etc. Exemplary iteration techniques may include an algebraic reconstruction technique (ART), a simultaneous iterative reconstruction technique (SIRT), a simultaneous algebraic reconstruction technique (SART), an adaptive statistical iterative reconstruction (ASIR) technique, a model-based iterative reconstruction (MBIR) technique, a sinogram affirmed iterative reconstruction (SAFIR) technique, or the like, or any combination thereof. For example, the reference images may be reconstructed using an iteration technique by performing one or more iterations based on an objective function. The objective function may be denoted by Equation (4) as follows:

$$\bar{\gamma}(x, n) = \min_{\gamma(x,n)} \sum\nolimits_{\{t | L(t)=n\}} \sum\nolimits_{l=1}^{N_c} \|d_l(k, t) - F_{\Omega,l}(t)\gamma(x, n)\|, \quad (4)$$

where $\bar{\gamma}(x,n)$ refers to a reference image, $L(t)$ refers to a total group count, $N_c$ refers to the number of the channels, $d_l(k,t)$ refers to image data in the k-space associated with a $l^{th}$ channel of the $t^{th}$ phase, and $F_{\Omega,l}(t)$ refers to an encoding function associated with the $l^{th}$ channel of the $t^{th}$ phase. The encoding function associated with the $l^{th}$ channel of the $t^{th}$ phase may be determined based on a coil sensitivity function associated with the $l^{th}$ channel of the $t^{th}$ phase and/or a sampling function associated with the $l^{th}$ channel of the $t^{th}$ phase. For example, the encoding function may be denoted by Equation (5) as follows:

$$F_{\Omega,l}(t)=\Omega(t)FS_l \qquad (5),$$

where $F_{\Omega,l}(t)$ refers to the encoding function associated with the $l^{th}$ channel of the $t^{th}$ phase, $\Omega(t)$ refers to an undersampling function associated with associated with the $t^{th}$ phase of the $l^{th}$ channel, F refers to 2-dimensional Fourier transform, and $S_l$ refers to a coil sensitivity function associated with the $l^{th}$ channel. The coil sensitivity function $S_l$ may denote a sensitivity distribution of RF coils in the MR scanner (e.g., the MR scanner 110). In some embodiments, the image reconstruction module 406 may determine the coil sensitivity corresponding to the $l^{th}$ channel based on the coil sensitivity function of the RF coils in the MR scanner (e.g., the MR scanner 110). The coil sensitivity function of the RF coils may be denoted by Equation (6) as follows:

$$S_l = \frac{F^{-1}(y_l(k) \odot G)}{sos(F^{-1}(y(k) \odot G))}, \qquad (6)$$

where $S_l$ refers to a coil sensitivity function of RF coils in an MR scanner, $F^{-1}$ refers to 2-dimensional inverse Fourier transform, $y_l(k)$ refers to image data in the k-space derived from a $l^{th}$ channel, $\odot$ refers to Hadamard product, G refers to a low pass filter (e.g., Gaussian filter), y(k) refers to the image data in the k-space, and sos refers to an operator that calculates a square-root-of-sum-of-square of the image data in the k-space.

In 510, an image sequence may be reconstructed based on the reference images and the plurality of phases of the image data in the k-space. Operation 510 may be performed by the image reconstruction module 406. In some embodiments, the image sequence may include a plurality of target images. The plurality of target images may be reconstructed using an iteration technique. For example, the plurality of target images may be determined by performing one or more iterations based on an objective function. The objection function may be constructed based on the reference images. In some embodiments, the objective function may include a fidelity component and a first regularization component. The fidelity component may represent a difference between estimated image data in a frequency domain associated with estimated images and the plurality of phases of the image data. The first regularization component may represent a difference between the estimated images and the reference images. The first regularization component may be configured to constrain the difference between the target images and the reference images. In some embodiments, the objective function may further include a second regularization component configured to constrain a sparsity of the target images in a frequency domain.

In some embodiments, the iteration technique may be combined with an optimization technique for reconstructing the target image. The optimization technique may be used to identify an optimal solution (e.g., the image sequence) of the objective function. For example, multiple estimated image sequences may be determined in each of the plurality of iterations. Each of the multiple estimated image sequences may include multiple estimated images. One of the multiple estimated image sequences may be determined as the image sequence based on a result of the determination that a preset condition is satisfied. In some embodiments, the preset condition may be such that the change in values of the objective function in the two or more consecutive iterations may be equal to or smaller than a threshold. The threshold may be set by a user (e.g., a doctor) or according to a default setting of the MRI system 100. In some embodiments, the preset condition may be such that the total times of the plurality of iterations may be equal to or larger than a preset threshold.

In some embodiments, the image reconstruction module 406 may determine the optimal solution (e.g., the image sequence) of the objective function based on a conjugate gradient descent technique, a simulated annealing technique, a Bregman technique, a Fixed-point Continuation (FPC) technique, a L1-magic technique, a L1-Ls technique, a Newton descent technique, a genetic technique, or the like, or any combination thereof. More detailed description of reconstructing the target images may be found elsewhere in the present disclosure (e.g., FIG. 8 and the descriptions thereof).

In general, for the image sequence including a plurality of images reconstructed based on cardiac image data in a k-space, time points may need to be determined for each of the plurality of images. According to process 500 described above, the image data in the k-space may be classified into a plurality of phases based on the time resolution for reconstructing the images, rendering the determination of the time points of the reconstructed images unnecessary. If the plurality of phases of the image data in the k-space is directly used to reconstruct the image sequence based on Fourier transformation, a function for determining the image sequence based on the plurality of phases may be underdetermined, which causes multiple solutions of the function (i.e., the image sequence). In order to accurately and conveniently determine the image sequence, the plurality of phases may be classified into a plurality of groups. The plurality of groups may be used to reconstruct a plurality of reference images. The image sequence may be reconstructed based on the plurality of phases of the image data in the k-space, the reference images, and/or the sparsity of the images in a frequency domain using an objective function. An optimal solution of the objective function may be determined based on the reference images, which may decrease computational burden and improve accuracy. The objective function may be constructed based on the sparsity of the target images in the frequency domain, which may decrease noises in the target images.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 6:
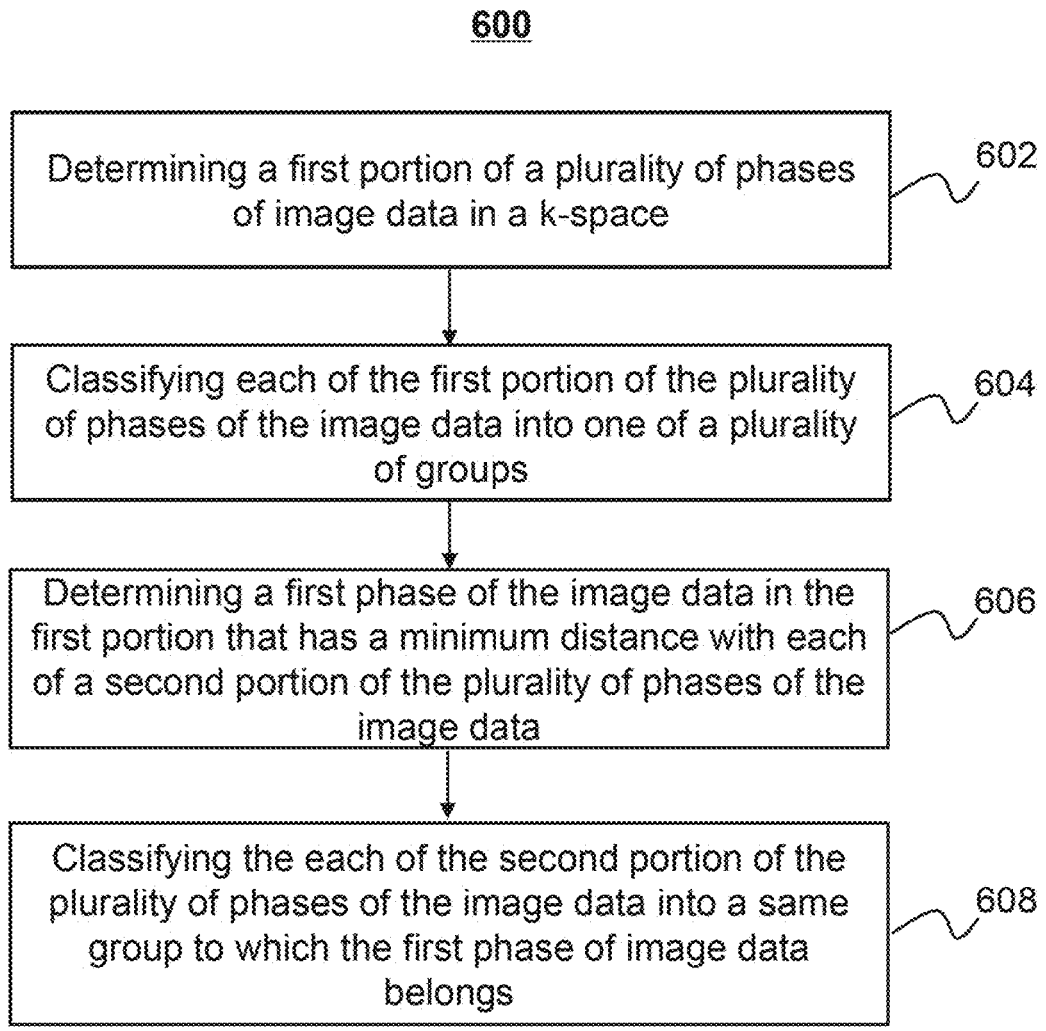
FIG. 6 is a flowchart illustrates an exemplary process for classifying phases of image data in a k-space into groups according to some embodiments of the present disclosure.

FIG. 6 is a flowchart illustrates an exemplary process for classifying a plurality of phases of image data in a k-space according to some embodiments of the present disclosure. In some embodiments, one or more operations of process 600 illustrated in FIG. 6 may be implemented in the MRI system 100 illustrated in FIG. 1. For example, process 600 illustrated in FIG. 6 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3). In some embodiments, operation 506 illustrated in FIG. 5 may be performed according to the process 600.

In 602, a first portion of a plurality of phases of image data in a k-space may be determined. Operation 602 may be performed by the classification module 404. The plurality of phases of the image data in the k-space may be obtained as described in connection with operation 502 in FIG. 5. In some embodiments, the classification module 404 may sort the plurality of phases of the image data in the k-space by time (e.g., $d(k, t_1)$, $d(k, t_2)$ $d(k, t_3)$, . . . , $d(k, t_n)$ as described in FIG. 8B). The total number (also referred to as total phase count) of the plurality of phases may be denoted by N, for example, an integer in the range of 20 to 40. The number of the first portion of the plurality of phases of the image data may be defined as the first phase count. The first phase count may be less than the total phase count. For example, the first phase count may be half of the total phase count.

In some embodiments, the classification module 404 may select the first portion of the plurality of phases of the image data from the plurality of phases of image data according to an instruction entered by a user via the terminal(s) 140. For example, the top first phase count of the plurality of phases of the image data may be selected as the first portion. As another example, the backward first phase count of plurality of phases of the image data may be selected as the first portion. In some embodiments, the first portion of the plurality of phases of the image data may be selected from the plurality of phases of image data according to a default setting of the MRI system 100. Alternatively, the first portion of the plurality of phases of the image data may be selected from the plurality of phases of the image data randomly.

In 604, each of the first portion of the plurality of phases of the image data may be classified into one of a plurality of groups. Operation 604 may be performed by the classification module 404. Each of the first portions of the plurality of phases of the image data may also be referred to as a reference phase belonging to one of the plurality of groups. The total number of the groups may be defined as a total group count. The first phase count of the first portion of the plurality of phases may be equal to the total group count. In some embodiments, each of the plurality of groups may be numbered according to the first portion of the plurality of phases of the image data. For example, the plurality of groups of the image data may be denoted by $L(t_1)$, $L(t_2)$, . . . , $L(t_D)$, where D refers to the total group count and $t_1, t_2, \ldots,$ and $t_D$ refers to the first portion of the plurality of phases.

In 606, a first phase of the image data in the first portion that has a minimum distance with each of a second portion of the plurality of phases of the image data may be determined. Operation 606 may be performed by the classification module 404. In some embodiments, for a specific phase of the image data in the second portion, the distances between the specific phase of the image data and each of the first portion of the plurality of phases of the image data may be determined, and a plurality of distances between the specific phase and the first portion of the phases of the image data may be obtained. The minimal distance among the plurality of distances may be determined, and the phase that has the minimal distance from the specific phase in the second portion may be designated as the first phase of the image data in the first portion.

In some embodiments, the first phase of the image data in the first portion may be determined based on a first objective function. For example, the phase of the first portion of the plurality of phases of the image data that minimizes the first objective function may be designated as the first phase of the image data. Alternatively, a phase of the first portions of the plurality of phases of the image data that causes a value of the first objective function smaller than a threshold may be designated as the first phase of the image data. As another example, the classification module 404 may determine a plurality of values of the first objective function. Each of the plurality of values may correspond to one of the first portion of the plurality of phases of the image data. The classification module 404 may determine a minimum value among the plurality of values of the first objective function. The classification module 404 may determine the phase corresponding to the minimum value as the first phase.

In some embodiments, the first objective function may be constructed based on a low pass filter. For each of the plurality of phases of the image data, at least one portion of the each of the plurality of phases of the image data may be filtered using the low pass filter. For example, image data with frequency values that are smaller than a frequency threshold may pass through the low pass filter, and image data with frequency values that are larger than the frequency threshold cannot pass through the low pass filter. The classification module 404 may determine filtered image data of each of the first portion of the plurality of phases and filtered image data of each of the second portion of the plurality of phases using the low pass filter. The frequency threshold may relate to the bandwidth of the low pass filter. For example, the frequency threshold may be equal to the frequency threshold. The bandwidth of the low pass filter may be determined and/or selected based on the sampling frequency for acquiring MR signals associated with the image data in the k-space. For example, the bandwidth of the low pass filter may be 0.01-0.1 times of the sampling frequency. The sampling frequency may be set by a user according to clinical demand or according to a default setting of the MRI system 100.

The first objective function may include a first component. For the each of the second portion of the plurality of phases of the image data, the first component may represent a first distance between the filtered image data of the each of the second portion of the plurality of phases and the filtered image data of a first reference phase (e.g., $d(k,t_2)$ as shown in FIG. 8B) in the first portion.

Alternatively or additionally, the first objective function may include a second component. The second component may represent a second distance between the filtered image data of the each of the second portion of the plurality of phases and the filtered image data of a second reference phase (e.g., $d(k,t_3)$ as shown in FIG. 8B) adjacent to the first reference phase in the first portion. As used herein, the second reference phase adjacent to the first reference phase refers to that there is no phase between the first reference phase and the second reference phase.

Alternatively or additionally, the first objective function may include a third component. The third component may represent a third distance between the filtered image data of the each of the second portion of the plurality of phases and the filtered image data of a third reference phase (e.g., $d(k,t_1)$ as shown in FIG. 8B) adjacent to the first reference phase in the first portion.

The first component, the second component, and the third component may have a first weight value, a second weight value, and a third weight value, respectively. The first weight value, the second weight value, and a third weight value may represent a relative contribution of the first component, the second component, and the third component to the value of the first objective function, respectively. In some embodiments, the first weight value, the second weight value, and/or the third weight value may be the same or different from each other. For example, the first weight value may be greater than the second weight value and the third weight value. As another example, the second weight value may be equal to or greater than the third weight value. The first weight value, the second weight value, and/or the third weight value may be a constant in a range from 0 to 2, or from 0 to 1, etc. The first weight value, the second weight value, and/or the second weight value may be set by a user (e.g., an operator or a doctor) or according to a default setting of the MRI system 100.

In some embodiments, the first objective function may be denoted by Equation (8), Equation (9), or Equation (10) as follows:

$$L(t) = \arg\min_{t} \sum_{s=1,\ldots,D} \|\Psi d(k, t) - \Psi d(k, t_s)\|_2^2, \quad (8)$$

$$L(t) = \quad (9)$$
$$\arg\min_{t} \sum_{s=2,\ldots,D} \{\|\Psi d(k, t) - \Psi d(k, t_s)\|_2^2 + \lambda_0 \|\Psi d(k, t) - \Psi d(k, t_{s\pm 1})\|_2^2\},$$

$$L(t) = \quad (10)$$
$$\arg\min_{t} \sum_{s=2,\ldots,D} \{\|\Psi d(k, t) - \Psi d(k, t_s)\|_2^2 + \lambda_0 \|\Psi d(k, t) - \Psi d(k, t_{s-1})\|_2^2 +$$
$$\lambda_0 \|\Psi d(k, t) - \Psi d(k, t_{s+1})\|_2^2\},$$

where L(t) refers to a group including a $t^{th}$ phase of the image data, t refers to a $t^{th}$ phase in the k-space, D refers to the total group count same as the first phase count, $\Psi$ refers to a low pass filter, d(k,t) refers to a phase of image data in the second portion, $\lambda_0$ refers to a weight value, and d(k,$t_s$), d(k,$t_{s+1}$), and d(k,$t_{s-1}$) refers to reference phases of the image data in the first portion respectively. The reference phase of the image data d(k,$t_{s+1}$) and the reference phase of the image data d(k,$t_{s-1}$) may be adjacent to the reference phase of the image data d(k,$t_s$).

In 608, each of the second portion of the plurality of phases of the image data may be classified into the same group to which the first phase of the image data belongs. In some embodiments, a phase count in each of the plurality of groups may be different. For example, according to Equation (10), the first group L($t_1$) and the last group L($t_D$) may include one single phase of the image data.

The movement of a subject (e.g., the heart) in an MR scan may be periodical and the image data relating to the subject in the k-space may be periodical, i.e., two or more phases of the image data in the k-space may correspond to a same or similar condition in different time periods. According to process 600, the plurality of phases of the image data may be classified into the plurality of groups based on a similarity between two phases so that two or more phases of the image data corresponding to the same or similar condition may be classified into the same group. Thus the quality of a reference image reconstructed based on a group of the image data corresponding to the same or similar condition in different time periods may be improved, for example, with lower motion artifact.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, operation 602 and operation 604 may be integrated into one single operation.

Figure 7:
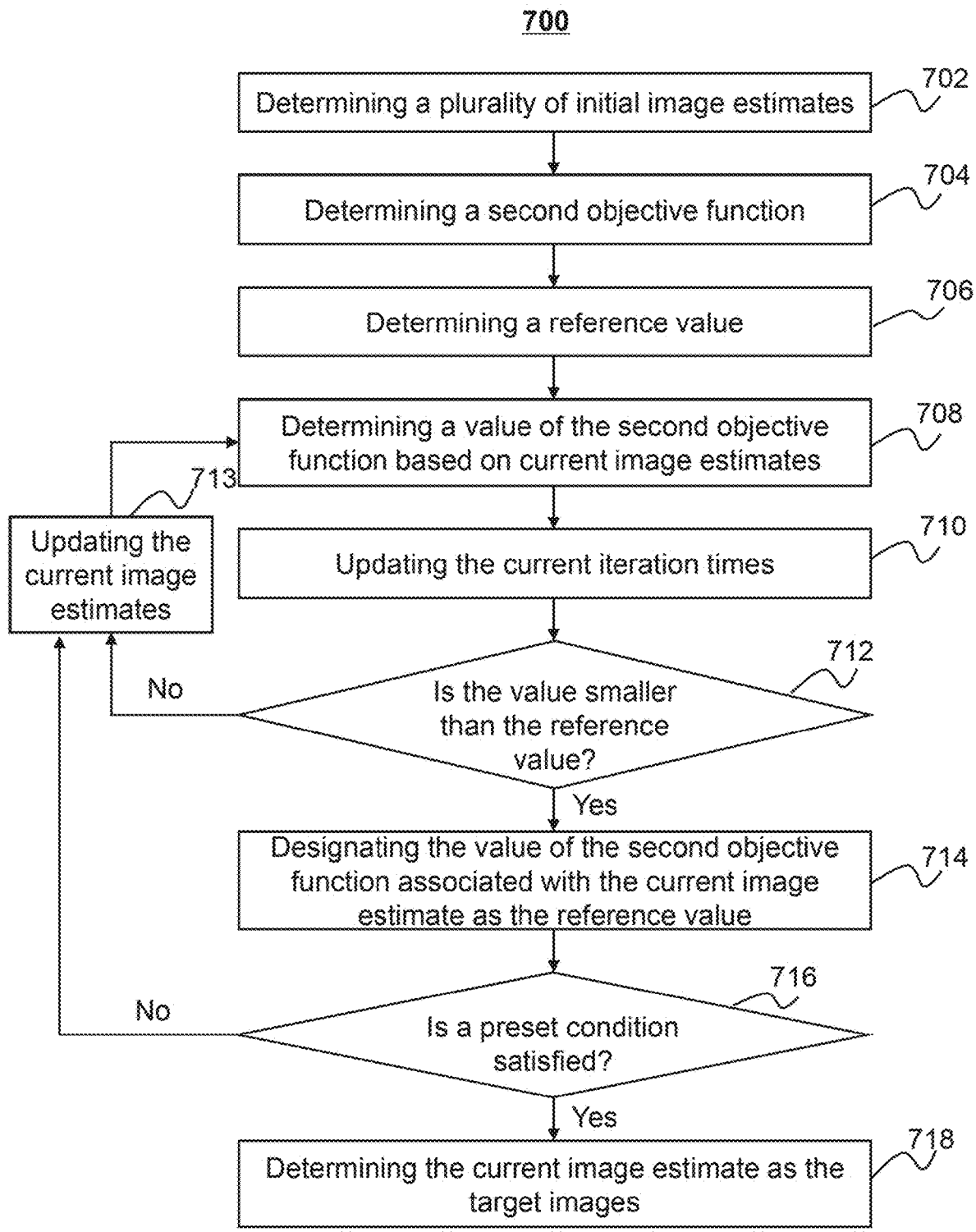
FIG. 7 is a flowchart illustrates an exemplary process for reconstructing a target image according to some embodiments of the present disclosure.

FIG. 7 is a flowchart illustrates an exemplary process for reconstructing an image sequence according to some embodiments of the present disclosure. In some embodiments, one or more operations of process 700 illustrated in FIG. 7 may be implemented in the MRI system 100 illustrated in FIG. 1. For example, process 500 illustrated in FIG. 7 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3). In some embodiments, operation 510 illustrated in FIG. 5 may be performed according to the process 700. Process 700 may be an iterative process including one or more iterations. At least one portion of operations (e.g., operations 708 to 716) in process 700 may be performed in each of the plurality of iterations. In some embodiments, an initial iteration time may be set to 0 or 1.

In 702, a plurality of initial image estimates may be determined. Operation 702 may be performed by the image reconstruction module 406. The plurality of initial image estimates may constitute an initial image sequence estimate. The number of the plurality of initial image estimates may be equal to the total number of the plurality of phases of the image data as described in connection with FIG. 5. The plurality of initial image estimates may be the same with or different from each other. In some embodiments, each of the plurality of initial image estimates may include a plurality of pixels or voxels with estimated characteristics, e.g., luminance values, gray values, colors or RGB values, saturation values. In some embodiments, the plurality of initial image estimates may be set by a user or according to a default setting of the MRI system 100. For example, the pixel values or voxel values in each of the plurality of initial image estimates may be set as different values or the same value. In some embodiments, the plurality of initial image estimates may be determined based on the reference images determined as described in operation 508. For example, one of the reference images may be designated as one of the plurality of initial image estimates. As another example, one of the reference images may be designated as the plurality of initial image estimates.

In 704, a second objective function may be determined. Operation 704 may be performed by the image reconstruction module 406. As used herein, the second objective function may be used to determine a target image sequence (also referred to as "optimal solution"). The target image sequence may include a plurality of target images. In some embodiments, an image sequence estimate including a plurality of image estimates may be determined as the target image sequence based on a result of the determination that a value of the second objective function corresponding to the image sequence estimate is smaller than or equal to a threshold. In some embodiments, an image estimate sequence may be determined as the target image sequence based on a result of the determination that a value of the second objective function corresponding to the image sequence estimate is minimum.

In some embodiments, the second objective function may include a fidelity component associated with the image data in the k-space obtained in 502, and a first regularization component associated with the reference images determined in 508. The fidelity component may represent and/or constrain differences between estimated image data in a frequency domain associated with image estimates generated in each iteration and the plurality of phases of the image data. The first regularization component may represent and/or constrain differences between the reference images and image estimates generated in each iteration. In some embodiments, the estimated image data in a frequency domain associated with the image estimates generated in each iteration may be determined by performing a transformation on the image estimates generated in each iteration. Further, the image estimates generated in each iteration may be transformed to the estimated image data in the frequency domain using a first transformation function (also referred to as a model). The first transformation function may include an encoding function associated with coil sensitivities of RF coils in an MR scanner as described elsewhere in the present disclosure (e.g., FIG. 5 and the descriptions thereof). In some embodiments, the estimated image data in the frequency domain associated with the image estimates generated in each iteration may be determined by multiplying the first transformation function by the image estimates generated in each iteration. Further, the first regularization component may be constructed based on the first transformation model. In some embodiments, the first transformation function may be part of default settings of the MRI system 100 or may be set by a user (e.g., a doctor).

In some embodiments, the second objective function may be denoted by Equation (11) as follows:

$$F_2 = \min_r \sum_t \sum_{l=1}^{Nc} \|d_l(k,t) - F_{\Omega,l}(t)\gamma(x,t)\|_2^2 + \lambda_1 \sum_t \|\gamma(x,t) - \bar{\gamma}(x,L(t))\|_2^2, \quad (11)$$

where $F_2$ refers to the second objection function, t refers to a $t^{th}$ phase in the k-space, $N_c$ refers to the number of the channels, $d_l(k,t)$ refers to image data in the k-space of a $l^{th}$ channel of the $t^{th}$ phase, $F_{\Omega,l}(t)$ refers to an encoding function associated with the $l^{th}$ channel of the $t^{th}$ phase, and $\gamma(x,t)$ refers to an image estimate associated with the $t^{th}$ phase of image data in the k-space, $\lambda_1$ refers to a first regularization parameter, and $\bar{\gamma}(x,L(t))$ refers to the reference image. The encoding function associated with the $l^{th}$ channel of the $t^{th}$ phase may be determined based on a sensitivity function of RF coils in the MR scanner and an undersampling function according to Equation (5) as described in FIG. 5.

In some embodiments, the second objective function may further include a second regularization component representing a sparsity of image data estimate in the frequency domain associated with image estimates generated in each iteration. The second regularization component may be configured to constrain a sparsity of the target images in a frequency domain. In some embodiments, a matrix including a plurality of elements associated with the image data estimate in the frequency domain may be determined by performing a vectorization operation on the image data estimate. The second regularization component may be used to represent the size of the matrix associated with the image data estimate in the frequency domain. The sparsity of the image data estimate in the frequency domain may be defined by the number of elements in the matrix that are larger than a preset value (e.g., 0). The greater the number of elements in the matrix larger than the preset value is, the sparser of the image data estimate in the frequency domain may be. The second regularization component may be configured to constrain the sparsity of the target images in the frequency domain. In some embodiments, the image data estimate in the frequency domain associated with image estimates generated in each iteration may be determined using a second transformation function. The second transformation function may include a Fourier transformation model. Further, the second regularization component may be constructed based on the second transformation function. In some embodiments, the second transformation function may be part of default settings of the MRI system 100 or may be set by a user (e.g., a doctor).

In some embodiments, the second objective function may be denoted by Equation (12) as follows:

$$F_2 = \min_r \sum_t \sum_{l=1}^{Nc} \|d_l(k,t) - F_{\Omega,l}(t)\gamma(x,t)\|_2^2 + \lambda_1 \sum_t \|\gamma(x,t) - \bar{\gamma}(x,L(t))\|_2^2 + \lambda_2 \|vec(\Gamma F_t)\|_1, \quad (12)$$

$$\text{where } \Gamma = [(vec(\gamma(x,t_1)), (vec(\gamma(x,t_2)), \ldots, (vec(\gamma(x,t_N)))], \quad (13)$$

where $F_2$ refers to the second objection function, t refers to a $t^{th}$ phase in the k-space, $N_c$ refers to the number of the channels, $d_l(k,t)$ refers to image data in the k-space of a $l^{th}$ channel, $F_{\Omega,l}(t)$ refers to an encoding function (also referred to as the first transformation function) associated with the $l^{th}$ channel of the $t^{th}$ phase, and $\gamma(x,t)$ refers to an image estimate associated with the $t^{th}$ phase of image data in the k-space, $\lambda_1$ refers to a first regularization parameter, $\bar{\gamma}(x,L(t))$ refers to a reference image, $\lambda_2$ refers to a second regularization parameter, $\Gamma$ refers to an image sequence including a plurality of images, and $F_t$ refers to a Fourier transform (also referred to as the second transformation function) in a time dimension. The first regularization parameter $\lambda_1$ and the second regularization parameter $\lambda_2$ may be set by a user according to a clinical demand or a default setting of the MRI system 100. For example, the first regularization parameter $\lambda_1$ and/or the second regularization parameter $\lambda_2$ may be a constant in a range from 0 to 2, or from 0 to 1, etc. The encoding function associated with the $l^{th}$ channel of the $t^{th}$ phase may be determined based on a sensitivity function of RF coils in the MR scanner and an undersampling function according to Equation (5) as described in FIG. 5.

In 706, a reference value associated with the second objective function may be determined. Operation 706 may be performed by the image reconstruction module 406. In some embodiments, the value of the second objection function corresponding to the initial image estimates may be designated as the reference value. In some embodiments, the reference value may be set as a value smaller than a threshold. The threshold may be preset by a user or operator or set automatically by the MRI system 100 according to, e.g., a default setting of the MRI system 100. For example, the reference value may be any value within a range of 0 to 1.

In 708, the value of the second objective function may be determined based on current image estimates. The value of the second objective function may be determined according to Equation (11) or Equation (12) as described in 704. For example, the value of the second objective function associated with the current image estimates may be determined by substituting a magnitude of each of the current image estimates into the second objective function. The magnitudes of each of the current image estimates may be determined by the intensity of a plurality of pixels inside the each of the current image estimates.

In 710, the current iteration times may be updated. Operation 710 may be performed by the image reconstruction module 406. In each iteration, the current iteration times may be added by 1.

In 712, whether the value of the second objective function is smaller than the reference value may be determined. Operation 712 may be performed by the image reconstruction module 406. In response to a determination that the value of the second objective function is equal to or greater than the reference value of the second objection function, process 700 may proceed to operation 713. In response to a determination that the value of the second objective function is smaller than the reference value, process 700 may proceed to operation 714.

In 713, the current image estimates may be updated. Operation 713 may be performed by the image reconstruction module 406. In some embodiments, the current image estimates may be updated based on prior image estimates generated in a previous iteration. In some embodiments, the current image estimates may be updated based on the reference images as described elsewhere in the present disclosure (e.g., FIG. 5 and the descriptions thereof).

In 714, the value of the second objective function associated with the current image estimates may be designated as the reference value. Operation 714 may be performed by the image reconstruction module 406. The reference value determined in 706 may be updated based on the value of the second objective function determined in 708.

In 716, whether a preset condition is satisfied may be determined. Operation 716 may be performed by the image reconstruction module 406. In response to a determination that the preset condition is not satisfied, process 700 may return to 713. In response to a determination that the preset condition is satisfied, process 700 may proceed to 718. In some embodiments, the preset condition may be a condition that the change in values of the second objective function in the two or more consecutive iterations may be equal to or smaller than a threshold. The threshold may be part of default settings of the processing device 120 or may be set by a user (e.g., a doctor). In some embodiments, the preset condition may be a condition that the current iteration times may be equal to or larger than a preset threshold. In some embodiments, if the current iteration times is equal to or larger than the preset threshold, the iteration may be terminated, and the process 700 may proceed to 718. In some embodiments, if the current iteration times is less than the preset threshold, process 700 may return to 713, and a next iteration may be started.

In 718, the current image estimates may be designated as the target images. Operation 718 may be performed by the image reconstruction module 406. In some embodiments, the current image estimates may be in the form of vectorization (e.g., the image sequence Γ determined based on Equation (12)). The target images may be obtained by performing a dimension conversion operation on the current image estimates (e.g., the image sequence Γ determined based on Equation (12)).

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, process 700 may further include one or more storing operations. For example, process 700 may include storing the value of the second objective function generated in each iteration. As another example, process 700 may include storing current iteration times.

FIG. 8A is a schematic diagram illustrating an exemplary angle between two adjacent spokes in a k-space according to some embodiments of the present disclosure. As shown in FIG. 8A, the two lines represent two adjacent spokes in a k-space. As described in connection with FIG. 5, the plurality of spokes in the k-space may be spaced by a preset azimuthal increment denoted by $\partial$ shown in FIG. 8A. The preset azimuthal increment $\partial$ may be 111. 25 degrees.

FIG. 8B is a schematic diagram illustrating exemplary spokes in a k-space according to some embodiments of the present disclosure. As described in connection with FIG. 5, the image data in the k-space may be classified into a plurality of phases denoted by $d(k,t_1)$, $d(k,t_2)$, $d(k,t_3)$ ..., $d(k,t_n)$ as shown in FIG. 8B. Each of the plurality of phases $d(k,t_1)$, $d(k,t_2)$, $d(k,t_3)$ ..., $d(k,t_n)$ may include a specific count of spokes, e.g., seven spokes shown in FIG. 8B. Two adjacent spokes in the each of the plurality of phases may have an azimuthal increment denoted by $\beta$ (e.g., 111. 25 degrees) as described elsewhere in the present disclosure (e.g., FIG. 5 and the descriptions thereof).

Figure 9A:
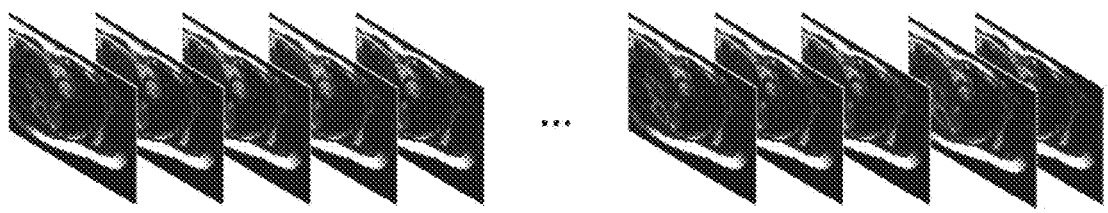
FIGS. 9A-9B are exemplary image sequences of a heart according to some embodiments of the present disclosure.
Figure 9B:
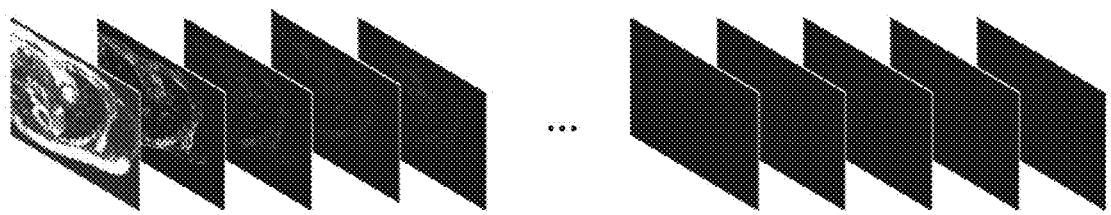

FIGS. 9A-9B are exemplary image sequences of the heart according to some embodiments of the present disclosure. As shown in FIG. 9A, a first image sequence relating to the heart includes a plurality of images in the time domain. As shown in FIG. 9B, a second image sequence in the temporal frequency domain was obtained by performing a fast Fourier transformation (FFT) on the temporal dimension of the first image sequence. The plurality of images in the second image sequence relating to the heart were sparse, which means that target images relating to the heart may be reconstructed based on the sparsity of image data (e.g., the image data in the k-space, MR signals, etc.) according to process 500, process 600 and/or process 700 as described in FIGS. 5-7.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer readable program code embodied thereon.

A computer readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C #, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A method for reconstructing an image sequence, the method being implemented on a computing device having at least one processor, and at least one computer-readable storage medium, the method comprising:
    obtaining image data in a k-space according to magnetic resonance (MR) signals acquired by a magnetic resonance imaging (MRI) scanner, the image data having a plurality of spokes;
    classifying the plurality of spokes into a plurality of groups based on a correlation of the plurality of spokes;
    reconstructing reference images based on the plurality of groups, each of the reference images corresponding to one of the plurality of groups; and
    reconstructing an image sequence based on the reference images and the plurality of spokes of the image data in the k-space.

2. The method of claim 1, wherein the image data is acquired by the MRI scanner via scanning a heart.

3. The method of claim 1, wherein the classifying the plurality of spokes into a plurality of groups based on a correlation of the plurality of spokes includes:
classifying the plurality of spokes in the k-space into a plurality of phases, wherein each of the plurality of phases has at least one spoke; and
classifying the plurality of phases of the image data in the k-space into the plurality of groups based on a correlation of the plurality of phases.

4. The method of claim 3, wherein the correlation of the plurality of phases of the image data includes similarities among the plurality of phases of the image data.

5. The method of claim 4, wherein the similarities among the plurality of phases are represented by distances between the pluralities of phases.

6. The method of claim 5, wherein the distances between the pluralities of phases include at least one of a Minkowski distance, a Euclidean distance, a Manhattan distance, or a Chebyshev distance.

7. The method of claim 5, wherein the classifying the plurality of phases of the image data in the k-space into the plurality of groups based on the correlation of the plurality of phases includes:
for each two of the plurality of phases of the image data, determining whether a similarity between the two phases of the image data exceeds a threshold,
in response to determining that the similarity exceeds the threshold, classifying the two phases of the image data into a same group of the plurality of groups.

8. The method of claim 5, wherein the classifying the plurality of phases of the image data in the k-space into the plurality of groups based on the correlation of the plurality of phases includes:
classifying the plurality of phases of the image data into a first portion of the plurality of phases of the image data and a second portion of the plurality of phases of the image data;
classifying each of the first portion of the plurality of phases of the image data into one of the plurality of groups; and
classifying each of the second portion of the plurality of phases of the image data into one of the plurality of groups based on the similarities among the plurality of phases.

9. The method of claim 8, wherein the classifying each of the second portion of the plurality of phases of the image data into one of the plurality of groups based on the similarities among the plurality of phases includes:
for each of the second portion of the plurality of phases of the image data,
determining a reference phase of the image data in the first portion which has a minimum distance with the phase of the image data in the second portion; and
classifying the phase of the image data in the second portion into a same group to which the reference phase of the image data belongs.

10. The method of claim 3, wherein a count of the at least one spoke of a phase is determined based on a temporal resolution associated with the reconstructed image and a repetition time (TR) of a pulse sequence for acquiring the MR signals.

11. The method of claim 3, wherein a count of the at least one spoke of a phase ranges from 21-55.

12. A system comprising:
a magnetic imaging (MR) scanner; and
a computing apparatus, the computing apparatus including at least one processor and at least one storage device, wherein
the at least one storage device storing executable instructions, and
the at least one processor in communication with the at least one storage device, when executing the executable instructions, causing the system to:
obtain image data in a k-space according to magnetic resonance (MR) signals acquired by a magnetic resonance imaging (MRI) scanner, the image data having a plurality of spokes;
classify the plurality of spokes into a plurality of groups based on a correlation of the plurality of spokes;
determine reference images based on the plurality of groups, each of the reference images corresponding to one of the plurality of groups; and
reconstruct an image sequence based on the reference images and the plurality of spokes of the image data in the k-space.

13. The system of claim 12, wherein the image data is acquired by the MRI scanner via scanning a heart.

14. The system of claim 12, wherein to classify the plurality of spokes into a plurality of groups based on a correlation of the plurality of spokes, the at least one processor causes the system to:
classify the plurality of spokes in the k-space into a plurality of phases, wherein each of the plurality of phases has at least one spoke; and
classify the plurality of phases of the image data in the k-space into the plurality of groups based on a correlation of the plurality of phases.

15. The system of claim 14, wherein the correlation of the plurality of phases of the image data includes similarities among the plurality of phases of the image data.

16. The system of claim 15, wherein the similarities among the plurality of phases are represented by distances between the pluralities of phases.

17. The system of claim 15, wherein to classify the plurality of phases of the image data in the k-space into the plurality of groups based on the correlation of the plurality of phases, the at least one processor causes the system to:
for each two of the plurality of phases of the image data, determine whether a similarity between the two phases of the image data exceeds a threshold,
in response to determining that the similarity exceeds the threshold, classify the two phases of the image data into a same group of the plurality of groups.

18. The system of claim 15, wherein to classify the plurality of phases of the image data in the k-space into the plurality of groups based on the correlation of the plurality of phases, the at least one processor causes the system to:
classify the plurality of phases of the image data into a first portion of the plurality of phases of the image data and a second portion of the plurality of phases of the image data;
classify each of the first portion of the plurality of phases of the image data into one of the plurality of groups; and
classify each of the second portion of the plurality of phases of the image data into one of the plurality of groups based on the similarities among the plurality of phases.

19. The system of claim 18, wherein to classify each of the second portion of the plurality of phases of the image data into one of the plurality of groups based on the similarities among the plurality of phases, the at least one processor causes the system to:
- for each of the second portion of the plurality of phases of the image data,
  - determine a reference phase of the image data in the first portion which has a minimum distance with the phase of the image data in the second portion; and
  - classify the phase of the image data in the second portion into a same group to which the reference phase of the image data belongs.

20. A non-transitory computer-readable medium storing at least one set of instructions, wherein when executed by at least one processor, the at least one set of instructions directs the at least one processor to perform acts of:
- obtaining image data in a k-space according to magnetic resonance (MR) signals acquired by a magnetic resonance imaging (MRI) scanner, the image data having a plurality of spokes;
- classifying the plurality of spokes into a plurality of groups based on a correlation of the plurality of spokes;
- determining reference images based on the plurality of groups, each of the reference images corresponding to one of the plurality of groups; and
- reconstructing an image sequence based on the reference images and the plurality of spokes of the image data in the k-space.

* * * * *